US007977567B2

(12) United States Patent
Bett et al.

(10) Patent No.: US 7,977,567 B2
(45) Date of Patent: Jul. 12, 2011

(54) PHOTOVOLTAIC MODULE AND THE USE THEREOF

(75) Inventors: Andreas Bett, Freiburg (DE); Joachim Jaus, Freiburg (DE)

(73) Assignee: Fraunhofer-Gesellschaft zur Forderung Angewandten Forschung E.V., Munich (DE)

( * ) Notice: Subject to any disclaimer, the term of this patent is extended or adjusted under 35 U.S.C. 154(b) by 0 days.

(21) Appl. No.: 12/467,498

(22) Filed: May 18, 2009

(65) Prior Publication Data
US 2009/0272427 A1    Nov. 5, 2009

Related U.S. Application Data

(63) Continuation of application No. PCT/EP2007/010563, filed on Dec. 5, 2007.

(30) Foreign Application Priority Data

Dec. 5, 2006    (EP) .................................. 06025105

(51) Int. Cl.
*H01L 31/05* (2006.01)
(52) U.S. Cl. ........................ 136/244; 136/256
(58) Field of Classification Search .......... 136/243–265; 438/57–98
See application file for complete search history.

(56) References Cited

U.S. PATENT DOCUMENTS

| 4,577,051 | A | * | 3/1986 | Hartman | 136/244 |
| 5,391,235 | A | * | 2/1995 | Inoue | 136/244 |
| 6,103,970 | A | * | 8/2000 | Kilmer et al. | 136/252 |
| 6,248,948 | B1 | | 6/2001 | Nakagawa et al. | |
| 6,252,158 | B1 | * | 6/2001 | Higashikawa | 136/258 |
| 2003/0213974 | A1 | | 11/2003 | Armstrong et al. | |
| 2004/0089338 | A1 | | 5/2004 | Kukulka | |
| 2005/0253142 | A1 | | 11/2005 | Negami et al. | |
| 2006/0054210 | A1 | * | 3/2006 | Proisy et al. | 136/244 |
| 2006/0144435 | A1 | * | 7/2006 | Wanlass | 136/249 |

FOREIGN PATENT DOCUMENTS

| EP | 0535614 | 4/1993 |
| EP | 1258925 | 11/2002 |

OTHER PUBLICATIONS

Dally et al., "The Design, Qualification and Use of Bypass Diode Integration onto GaAs/Ge Solar Cells" Conference Proceedings Article, May 13-17, 1996, pp. 333-335.
Jaus et al., "Heat Sink Substrates for Automated Assembly of Concentrator Modules" Presented at the 21st European Photovoltaic Solar Energy Conference and Exhibition, Sep. 4-8, 2006, pp. 1-4.

(Continued)

*Primary Examiner* — Basia Ridley
*Assistant Examiner* — Christina Chern
(74) *Attorney, Agent, or Firm* — Gauthier & Connors LLP

(57) ABSTRACT

The present invention relates to a photovoltaic module, comprising at least two component cell groups (SCA) which are connected to each other and disposed on an electrically insulating basic body, which groups comprise respectively one solar cell which is applied on a thermally and electrically conductive carrier and a bypass diode which is applied at a spacing thereto, and which are contacted with each other via an electrical conductor, the bypass diode having a polarity which is inverse to the solar cell and the solar cell and the bypass diode being applied on the conductive carrier via a conductive connecting layer.

17 Claims, 2 Drawing Sheets

OTHER PUBLICATIONS

Figure 1:
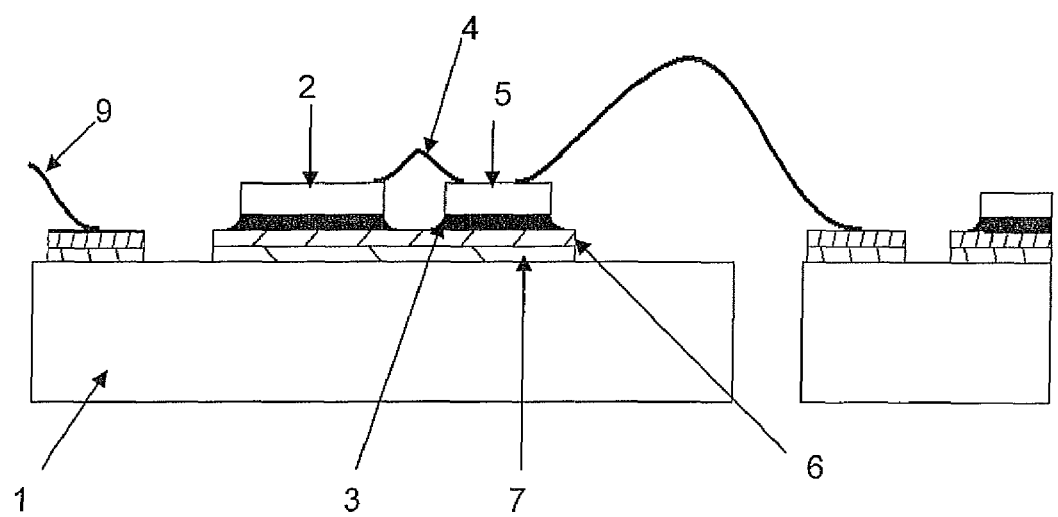

English translation of the International Preliminary Report on Patentability issued in PCT/EP2007010563.

English translation of Chinese Office Action issued in connection with corresponding Chinese Application No. 200780045161.0.

English translation of second Chinese Office Action issued in connection with corresponding Chinese Application No. 200780045161.0.

* cited by examiner

PHOTOVOLTAIC MODULE AND THE USE THEREOF

PRIORITY INFORMATION

This application is a continuation of PCT Application No. PCT/EP2007/010563 filed on Dec. 5, 2007, that claims priority to European Application No. 06025105.5, filed on Dec. 5, 2006. Both applications are incorporated herein by reference in their entireties.

BACKGROUND OF THE INVENTION

The present invention relates to a photovoltaic module which is distinguished by a special series connection of solar cells on a carrier substrate. In order to make this possible, an insulating layer must be present, said insulating layer being produced by a diode in the case of the invention. In the photovoltaic module, this diode serves at the same time as protective or bypass diode. In this case, two functions are hence integrated in one system, which leads to significant advantages in cost.

In photovoltaics, normally a plurality of solar cells are combined to form large units (arrays, modules). Within one array, a plurality of solar cells are thereby connected either in parallel or in series. For this purpose, an electrical conductive connection of one to the next solar cell is required. It is also known in the state of the art to use bypass diodes in modules or arrays for the protection of the solar cells. This is necessary since it can occur that individual solar cells within one module are subjected to a voltage in the stop band, which would lead to the destruction of these solar cells.

A special field of photovoltaics is the so-called "concentrator photovoltaics", in which sunlight is concentrated by means of an optical system (e.g. lens, mirror) and the concentrated light beam impinges on a relatively small solar cell—according to the type of unit. Because of the light concentration, heat is produced locally which must be dissipated. According to the system, this is effected passively or by active cooling, e.g. by means of water.

The state of the art for series connection of solar cells in such a concentrator module is described by J. Jaus (J. Jaus, U. Fleischfresser, G. Peharz, F. Dimroth, H. Lerchenmüller, A. W. Bett, "HEAT SINK-SUBSTRATES FOR AUTOMATED ASSEMBLY OF CONCENTRATOR-MODULES", Proc. of 21$^{st}$ European Photovoltaic Conference and Exhibition, Dresden, September 2006, to be published). In this publication, the so-called prepreg technology and also the use of copper plates with gold-plated circuit boards is presented in detail. However this known technology has the following disadvantages:

According to the technology, a fairly large number of individual parts is required, for which costs arise in production and also in storage and manufacturing logistics.

In the assembly of the individual parts, many operating steps occur, "preparation of the surfaces", "application of connecting materials (adhesive, solder)", "gripping and positioning part", "setting of the adhesive layers" or "implementing the soldering process", frequently even further process-accompanying steps.

This large number of operating steps increases the cycle times, lowers the throughput of the production line and increases the material expenditure. Consequently high costs are ultimately incurred.

Individual steps, such as e.g. contacting of the individual solar cell chips, incur high process costs (soldering process) and handling costs.

Prepreg technology has proved in practice to be susceptible to faults: during production, burrs are produced which can lead to short circuits. This makes complex tests necessary and the individual prepregs comparatively expensive.

However photovoltaic modules must be produced economically. In order to be able to achieve low costs, the number of components to be assembled must be low and the components themselves should be economical at the same time. In particular the assumption of a plurality of functionalities in one component helps to reduce costs.

SUMMARY OF THE INVENTION

It is hence the object of the present invention to indicate a photovoltaic module which is simple and economical in construction and which enables, at the same time, safe operation in the case of a series connection.

This object is achieved by the photovoltaic module having the features of claim 1. The dependent claims thereby represent preferred embodiments. Possibilities for use are mentioned in claim 20.

According to the invention, a photovoltaic module is proposed, which comprises at least two component cell groups (SCA) which are connected to each other and disposed on an electrically insulating basic body, which groups have respectively one solar cell which is applied on a conductive carrier and a bypass diode which is applied at a spacing thereto, and which are contacted with each other via an electrical conductor, in the case of which the bypass diode has a polarity which is inverse to the solar cell and the solar cell and the bypass diode are applied on the conductive carrier via a conductive connecting layer.

The module according to the invention makes it possible to assume a plurality of functions as a result of its special design, for which functions a plurality of different components are required according to the state of the art.

Many advantages result therefrom, such as e.g.:
Lower logistics expenditure in the operating preparation, storage and assembly,
Less material use,
Less mechanical and personnel outlay,
Lower costs.

In actual concentrator systems, such as e.g. the FLAT-CON-system (see publication by J. Jaus), the heat is dissipated via metallic cooling bodies. For the assembly of the solar cell, the rear-side and the front-side contact must thereby be contacted insulated from each other in order to avoid a short circuit of the solar cell. For this purpose, an electrically non-conductive intermediate layer which is however not intended to restrict the heat transport is used.

The module according to the invention is now distinguished in that it allows both a connection of the cells which is protected by bypass diodes to form an array and also optimum heat transport. Basically the use of the module according to the invention is hence possible in every system in which an electrical connection with simultaneously good heat dissipation is necessary (e.g. even in satellite arrays).

In the case of the module according to the invention, the electrically conductive carrier of the SCA is thereby preferably a planar carrier made of copper, an alloy containing copper, zinc-plated steel and/or aluminium. It is thereby favourable if the conductive carrier has a thickness of 20 to 1000 μm.

Furthermore, the conductive connecting layer is preferably formed from a solder and/or conductive adhesive. However the invention also comprises all the possibilities known in the state of the art for the production of conductive connections.

A further advantageous embodiment provides that a gold, nickel, titanium and/or palladium layer is applied on the conductive carrier, at least in the region of the bypass diode and/or of the solar cell.

The advantage of this embodiment resides in the fact that contacting with the respective conductor is consequently improved. The above-described additional coating can therefore also be applied even in the region of the carrier in which the conductor of the bypass diode is contacted on the next SCA.

Any solar cell can be used as solar cell in the invention, however a III-V semiconductor or Si solar cell are used preferably. As known in the state of the art, monolithic solar cells are thereby preferred. The invention thereby also includes multiple cells.

Likewise, all the diodes known from the state of the art can be used for implementing the invention. Advantageous diodes for bypass diodes are planar pn-semiconductor diodes.

The surface of the diode thereby preferably comprises a gold, nickel, silver, titanium, palladium and/or aluminium layer.

It is of advantage in particular if the conductor which connects the solar cell and the bypass diode is a wire made of gold, aluminium or copper, the aluminium being able to contain also 0 to 2% by weight silicon and/or 0 to 2% by weight magnesium.

Furthermore, it is essential to the invention that the connection of the at least two SCAs is effected by a conductor which leads from the bypass diode of the first SCA to the conductive carrier of the second carrier SCA. The conductor is thereby in turn in particular a wire, made of gold, aluminium or copper, the aluminium being able to contain 0 to 2% by weight silicon and/or 0 to 2% by weight magnesium.

With respect to the geometric arrangement of the solar cell on the conductive carrier, any position is possible, it is particularly favourable if the solar cell is disposed essentially in the centre on the metallic carrier.

The metallic carrier is likewise not restricted to any special embodiment. Preferably, the metallic carrier is polygonal, preferably rectangular. Further preferred shapes are for example, hexagonal structures which enable a space-saving arrangement, like the square or rectangular embodiments.

The bypass diode can be disposed anywhere on the metallic carrier. The bypass diode is preferably disposed in the immediate vicinity of the solar cell. The spacing from the solar cell can for example be between 0.5 and 50 mm, preferably between 1 and 10 mm.

In principle, any number of SCAs, at most up to 1000, can be connected together in series. Preferably 40 to 200 cells are connected.

The insulating basic body can be manufactured from any insulating material. Preferably, the materials are selected from a glass plate or a metal plate coated with an insulating, dielectric layer. The layer thickness of the insulating, dielectric layer is thereby preferably from 0.05 to 0.1 mm, whilst the insulating basic body is preferably 0.1 to 5 mm thick.

According to the invention, the photovoltaic modules are used in particular in highly-concentrated photovoltaic modules.

As described above, the module according to the invention is distinguished in that only simple and economical components are required, such as copper plates, a diode which is contacted in a planar manner and the solar cell. The particular feature of the invention resides in the fact that the bypass diode which is required in a module connection assumes the functionality of an insulating contact layer with outstanding heat conduction at the same time. This property prevents carbonising of the contact pad based on circuit board material, as was observed in field tests. This is a consequence of an "off-point" position of the module on the tracking unit. In this case (a fault in the system), the light is not focused on the solar cell but on an undefined site in the module. This fault can occur in reality and is therefore tested also in the IEC standard "IEC 62108 Draft 8d: Concentrator Photovoltaic (CPV) Modules and Assemblies—Design Qualification and Type Approval". The focused light beam can impinge for example on the cut edge of a circuit board. Because of the high energy density, the result then is combustion of the organic material of the circuit board, which impairs the functionality as insulating layer. If the bypass diode serves as contact pad, there are no organic materials present and the heat is dissipated very well by the Si diode. The susceptibility to faults is hence significantly lowered. Furthermore, the circuit board can itself be eliminated, which lowers further costs.

The subject according to the invention hence enables the construction of a sub-assembly based on a simple copper plate. In comparison with prepreg technology, as was represented in the description of the state of the art, a more economical production of the connection is made possible with the construction according to the invention. The advantages of the module according to the invention are summarised in the following.

- The electrical contacting of the rear-side of the solar cell directly on the cooling body allows a good thermal connection.
- The front-side contact of the solar cells is guided on the bypass diode which is contacted in a planar manner.
- The rear contact of the bypass diode is contacted directly on the copper plate, which makes possible good thermal dissipation of the heat.
- The electrically insulating function is ensured by the pn-junction of the bypass diode—no organic materials are used.
- The smallest possible number of components is used for the production of the solar cell sub-assembly, which leads to a high throughput in manufacture.
- In the case of a fault in the system (off-pointing), the functionality is maintained—the susceptibility to faults of the concentrator system is reduced.

The solution according to the invention hence makes it possible to integrate a plurality of these functions in one component, as a result of which the (cost) advantages which are normal in the case of integration (fewer process steps, less use of material etc.) are produced.

The present invention is explained in more detail with reference to the accompanying Figures without wishing to restrict the invention to the special features.

DETAILED DESCRIPTION OF THE ILLUSTRATED EMBODIMENTS

There are thereby shown

Figure 2:
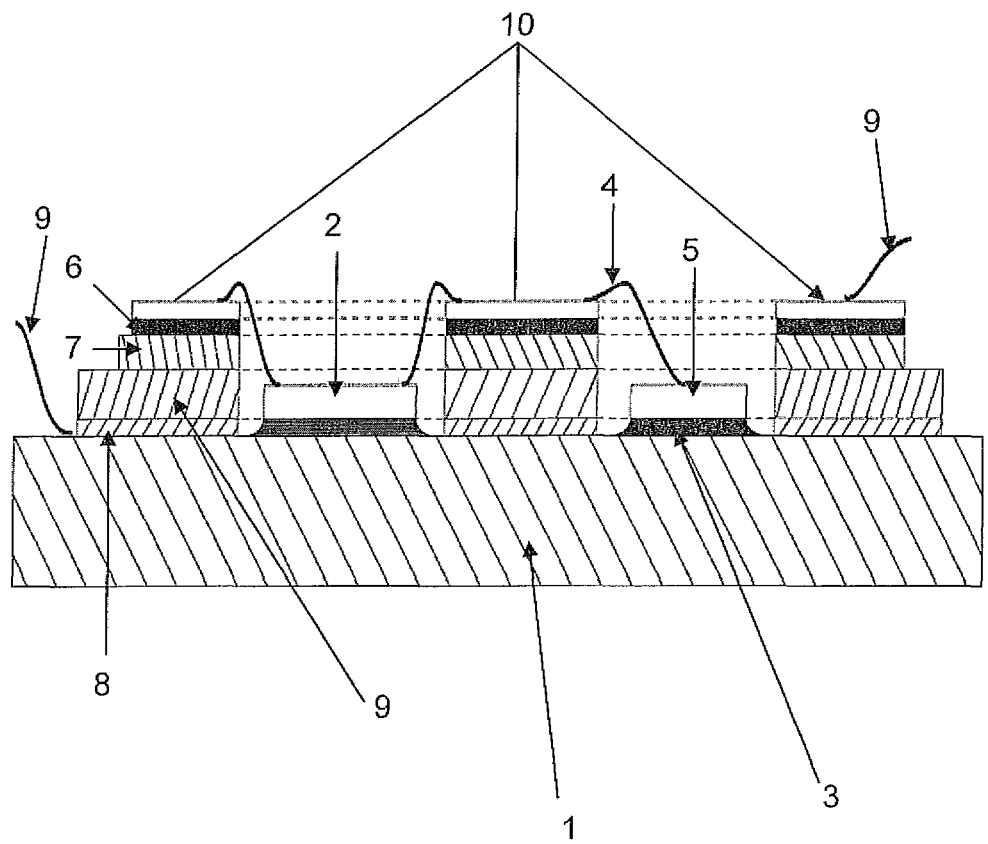

FIG. 1 the construction according to the invention of a photovoltaic module,

FIG. 2 a schematic representation of a photovoltaic module with circuit board technology according to the state of the art.

FIG. 1 shows the typical construction of a connection according to the invention. The electrical component 2, e.g. a solar cell, is applied on a carrier substrate 1, e.g. made of copper. The rear-side of the solar cell 2 is connected by an electrically and thermally conductive connection 3, e.g. solder or silver conductive adhesive. The front-side of the component is contacted for example by bonding or welding technology to a conductor 4. The wire length is thereby limited and is guided on a contact pad 5 which is insulated relative to the carrier substrate 1. For the present invention, the contact pad 5 comprises a planar diode which has an inverse polarity in comparison with the solar cell 2. The totality of the elements 1 to 5 is termed component cell group (SCA). In the embodiment according to FIG. 1, an Au/Ni plating (6, 7) is applied in addition on the carrier 1. This serves for better contacting. A plurality of component cell groups (SCAs) can be applied on an electrically insulating basic body, e.g. a glass plate (not represented here). The component cell groups (SCAs) are connected by the contact pad top side 5 to the next carrier of the SCA, e.g. by soldering of wires 9 or thick wire bonding technology. As a result of this arrangement, the subassemblies (SCAs) are connected in series. Within each subassembly, the bypass diode 5 which is connected in parallel protects, as contact pad, the solar cell 2 from any possible reverse loading.

A construction known from the state of the art of a photovoltaic module is illustrated in FIG. 2.

The carrier substrate 1 is hereby formed from a 1 mm thick copper plate which serves mainly for heat transfer and also for electrical connection of the rear-side of the solar cell. A thin epoxy resin-impregnated glass fibre mat is applied as dielectric layer 8 on this copper plate 1. In turn, a copper foil 9 which serves for electrical connection of the front contacts of the solar cell is applied thereon. The upper copper layer 9 thereby has another nickel layer 7 and a gold layer 6. In order to ensure good heat transfer, it is required that the solar cell 2 and the bypass diode 6 are applied directly on the copper base layer. The thermal contacting for the electrical conductive carrier substrate 1 is thereby effected again by a thermally conductive solder 3. In contrast to the present invention, in the case of photovoltaic modules as are known in the state of the art (e.g. in the present FIG. 2), the solar cell 2 is not connected directly to the bypass diode 5 via a wire 4, instead the electrical contact production extends over the structures 10 applied on the carrier substrate 1. The electrical connection of the photovoltaic modules to each other is likewise effected via the contacts 9, not starting directly from the bypass diode but always indirectly via the structures 10. A substantially more complex construction of a photovoltaic module is hence produced all in all, which has a disadvantageous effect on production methods and production costs. Due to the substantially simpler construction of the photovoltaic module according to the invention, as represented in FIG. 1, these disadvantages can be avoided.

By means of the described subject of the invention, it is possible to accelerate the production method significantly, to use fewer components and to increase the reliability significantly. In summary, costs can consequently be reduced considerably.

What is claimed is:

1. A photovoltaic module, comprising at least two component cell groups (SCA) which are connected to each other and disposed on an electrically insulating basic body, wherein each group comprises respectively one III-V semiconductor solar cell which is applied on a thermally and electrically conductive carrier and a pn-semiconductor bypass diode made of silicon which is applied at a spacing thereto, and wherein the solar cell is contacted with the bypass diode via an electrical conductor, wherein the bypass diode has a polarity which is inverse to the solar cell and the solar cell and the bypass diode are applied on the conductive carrier via a conductive connecting layer, and wherein the connection of at least two SCAs is effected by a conductor which leads from the bypass diode of the first SCA to the conductive carrier of the second SCA.

2. The photovoltaic module according to claim 1, wherein the electrically conductive carrier of the SCA is a planar carrier made of copper, an alloy containing copper, zinc-plated steel and/or aluminum.

3. The photovoltaic module according to claim 2, wherein the conductive carrier has a thickness of 20 to 1000 μm.

4. The photovoltaic module according to claim 1, wherein the conductive connecting layer is formed from a solder and/or conductive adhesive.

5. The photovoltaic module according to claim 1, wherein a gold, nickel, titanium and/or palladium layer is applied on the conductive carrier, at least in the region of the bypass diode and/or of the solar cell.

6. The photovoltaic module according to claim 1, wherein the solar cell is a monolithic solar cell.

7. The photovoltaic module according to claim 1, wherein the bypass diode is a planar pn-semiconductor diode.

8. The photovoltaic module according to claim 1, wherein the surface of the diode is a gold, nickel, silver, titanium, palladium and/or aluminium surface.

9. The photovoltaic module according to claim 1, wherein the conductor which connects the solar cell and the bypass diode is a wire made of gold, aluminium or copper.

10. The photovoltaic module according to claim 1, wherein the conductor is a wire made of gold, aluminium or copper.

11. The photovoltaic module according to claim 9, wherein the conductor is a wire made of aluminium with 0 to 2% by weight Si and/or 0 to 2% by weight Mg.

12. The photovoltaic module according to claim 1, wherein the solar cell is disposed essentially in the centre on the conductive carrier.

13. The photovoltaic module according to claim 12, wherein the conductive carrier is polygonal, preferably rectangular.

14. The photovoltaic module according to claim 1, wherein two to 1000 SCAs are connected in series.

15. The photovoltaic module according to claim 1, wherein the insulating basic body is a glass plate or a metal plate coated with an insulating, dielectric layer.

16. The photovoltaic module according to claim 15 wherein the layer thickness of the insulating, dielectric layer is 0.05 to 0.1 mm.

17. The photovoltaic module according to claim 1, wherein the insulating basic body is 0.1 to 5 mm thick.

* * * * *